United States Patent
Yiannoulos

[19]

[11] Patent Number: 5,982,318
[45] Date of Patent: Nov. 9, 1999

[54] LINEARIZING OFFSET CANCELLING WHITE BALANCING AND GAMMA CORRECTING ANALOG TO DIGITAL CONVERTER FOR ACTIVE PIXEL SENSOR IMAGERS WITH SELF CALIBRATING AND SELF ADJUSTING PROPERTIES

[75] Inventor: Aristides Antony Yiannoulos, Wyomissing Hills, Pa.

[73] Assignee: Lucent Technologies Inc., Murray Hill, N.J.

[21] Appl. No.: 08/948,632

[22] Filed: Oct. 10, 1997

[51] Int. Cl.$^6$ ........................................ H03M 1/12
[52] U.S. Cl. ........................ 341/155; 348/294; 382/271
[58] Field of Search ................................. 341/155, 169, 341/157, 161, 164, 165; 382/276, 218, 209, 270, 271; 348/294, 207

[56] References Cited

U.S. PATENT DOCUMENTS

| | | | |
|---|---|---|---|
| 4,151,516 | 4/1979 | O'Neill | 340/347 |
| 4,448,549 | 5/1984 | Hashimoto et al. | 374/170 |
| 5,138,552 | 8/1992 | Weedon et al. | 364/413.5 |
| 5,457,458 | 10/1995 | Saxon | 341/157 |

*Primary Examiner*—Brian Young
*Assistant Examiner*—Peguy Jean Pierre

[57] ABSTRACT

A novel analogue to digital (A/D) converter semiconductor integrated circuit intended for digitizing signals generated by a physical stimulus sensing electronic apparatus, and more particularly, for digitizing signals generated by an array of photo-integrator circuits of an active pixel sensor (APS) imaging device. The A/D converter is a modified single slope integration type, wherein the reference ramp signal exhibits predetermined nonlinearity and offset. The nonlinearity and offset of the reference ramp signal track the nonlinearity and offset components in the signal being digitized, the latter being nonlinearity and offset components contributed by sources appearing in advance of the A/D conversion point in the signal acquisition and processing path of a digital camera system. In particular, the ramp generator for an A/D converter intended for an APS imaging array is partly a replica of the active photo-integrator circuit used in the APS pixel array fabricated on the same semiconductor substrate as the APS array. The ramp generator differs from a photo-integrator in that it produces output by responding to input provided by a current source rather than a photo-sensing device. As the ramp generator and the signal path nonlinearities and offsets track regardless of manufacturing variations and variations in operating conditions, the A/D conversion process successfully linearizes and removes offsets from the signal path, self calibrating against manufacturing variations and self adjusting against variations in operating conditions. The A/D converter further provides white balancing and gamma correction functionality for APS imager cameras. White balancing is performed by using different valued current sources in the ramp generators providing A/D conversion reference ramp for each different color in the color space sampled by the APS array. Gamma correction is performed by clocking the counter of the A/D converter with a clock frequency varying with time. The A/D converter replaces costly and technically less effective digital signal processing (DSP) means which were previously required.

39 Claims, 5 Drawing Sheets

5,982,318

LINEARIZING OFFSET CANCELLING WHITE BALANCING AND GAMMA CORRECTING ANALOG TO DIGITAL CONVERTER FOR ACTIVE PIXEL SENSOR IMAGERS WITH SELF CALIBRATING AND SELF ADJUSTING PROPERTIES

FIELD OF THE INVENTION

This invention relates to electronic components for image sensing, capturing, and signal processing, and more specifically to Very Large Scale Integrated (VLSI) semiconductor technology apparatus comprising active pixel imaging arrays for image sensing and capturing, together with signal processing functionality for video, and for still-picture digital type cameras.

BACKGROUND OF THE INVENTION

Charge Coupled Device (CCD) imaging arrays have made possible the high quality imagers now used in consumer camcorder equipment, scanners for FAX machines, and video cameras for a wide range of applications including video-conferencing and portable equipment for professional TV broadcasting. However, the quality of signal produced by such imagers is known to deteriorate as the size of the imaging array increases because of limitations that are inherent to CCD signal handling. The size of an imaging array determines the resolution capability of the array. High resolution arrays are needed for studio quality TV production, for professional quality still photography, for cinematography, and for HDTV (High Definition TV) which is about to be deployed as a new broadcast standard around the world.

APS (Active Pixel Sensor) imaging arrays, which are proposed as an alternative to CCD imaging arrays primarily because they are compatible with standard VLSI technologies, are free of limitations with respect to scaling and to attaining very large sizes. The potential for using APS arrays for building large imaging arrays for many products of the future is however hampered, because the response of APS imagers can be prohibitively nonlinear. Nonlinearity distorts the gray scale response of an imager, and complicates signal offset cancellation. Signal offset cancellation is necessary for accurate color imaging. So far, all efforts to linearize and offset justify the response of APS arrays have been based on using DSP (Digital Signal Processing) techniques. These have proven too costly and also to a large degree technically ineffective. DSP based linearization, and offset cancellation are ineffective because they cannot be made to self calibrate against manufacturing variations, and because they cannot be made to continuously adjust to variations in an application's operating conditions.

Additionally, all APS imaging systems generally require means for color balancing and gamma correcting the imaging array. These requirements further increase the complexity of the DSP resources that must be devoted to the APS arrays implemented using currently known techniques.

SUMMARY OF THE INVENTION

In response to the above-identified shortcomings of the prior art, in the present invention the response of an APS imaging array is linearized and offset cancelled in the course of converting the analog signal output of the array into a digital signal. The present invention self calibrates against manufacturing variations, and self adjusts to variations in operating conditions by employing sophisticated, error tracking and canceling integrated circuit techniques. The present invention also advantageously integrates white balancing and gamma correcting functionality within the scope of the analog to digital conversion process. In particular, integrating color balancing and gamma correction functionality within the scope of the analog to digital conversion process reduces system costs, because it makes possible to integrate this functionality on the same VLSI semiconductor substrate as the APS imaging array.

BRIEF DESCRIPTION OF THE DRAWINGS

The and its mode of operation will become apparent from the following detailed description when considered in conjunction with the accompanying drawings. It is to be understood, however, that the drawings are designed solely for purposes of illustration and not as a definition of the limits of the invention, for which reference should be made to the appended claims.

In the drawings, wherein like reference characters denote similar elements throughout the several views.

Throughout the drawing, the same element when shown in more than one figure is designated by the same reference numeral.

DETAILED DESCRIPTION OF THE PREFERRED EMBODIMENTS

Figure 1:
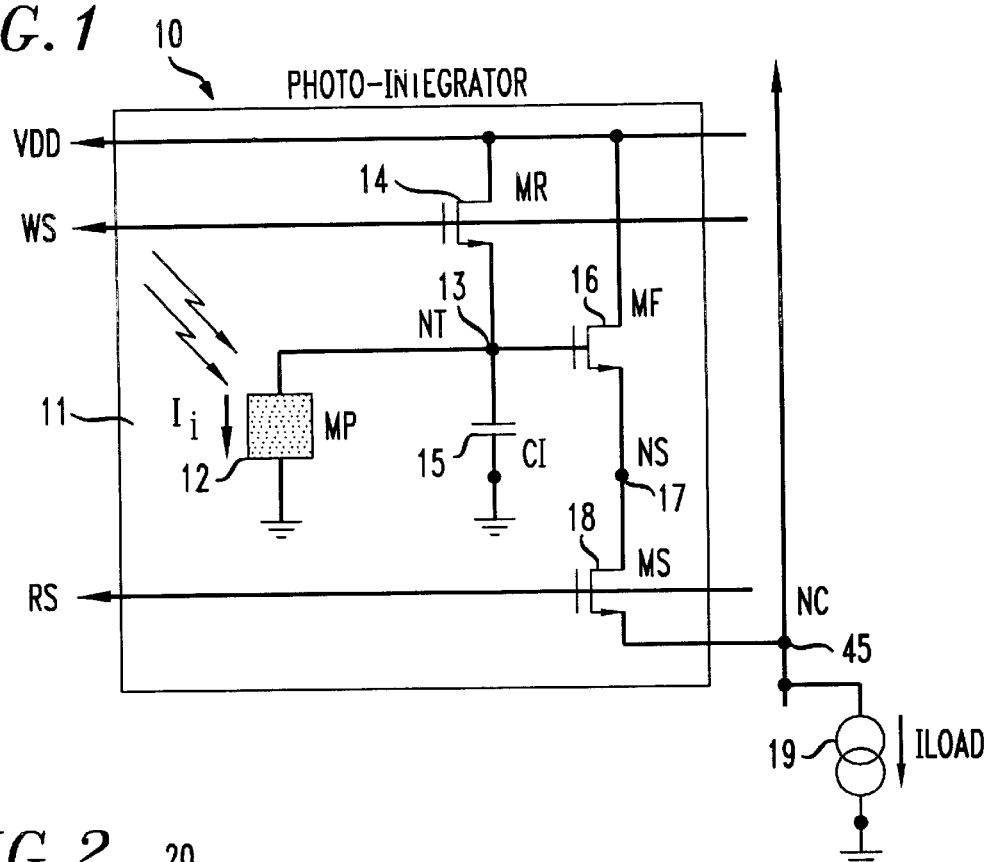
FIG. 1 is a schematic representation of a preferred photo-integrator circuit forming a part of the instant invention.

Introduction:

An APS imaging array (APS array), is an array of active photo-integrator circuits. An APS imager is an electronic device integrated within the context of a Metal Oxide Semiconductor (MOS) technology: it comprises an APS array and related signal processing circuitry for capturing an image electronically. An APS imager can be used in both still and motion video cameras. Since even for low resolution applications, an APS array is potentially an array of millions of photo-integrator circuits, there is a practical upper limit on the size, and hence on the capabilities of a photo-integrator circuit that can be adopted for APS array use. In particular, it is impractical to require each photo-integrator circuit in an APS array to provide linear response, offset cancellation, self calibration against manufacturing tolerances, and self adjusting against variations in operating conditions. Accordingly, APS arrays produce signals with errors. A camera system using an APS imager must remove these errors with corrective functions inserted at one, or more points in its downstream signal processing path.

In most recent art, these corrective functions are digitally performed by the camera's digital signal processor. The present invention places these corrective functions at the Analog to Digital (A/D) signal conversion point that precedes the camera's digital signal processor. The circuit providing these functions is an extension of a base A/D converter circuit performing A/D conversion according to the known principle of single slope integration. The relation of this circuit to other known A/D converters will become apparent in the course of succeeding discussion. Placed in appropriate architectural framework, the A/D converter circuit according to the present invention may further provide the white balancing and gamma signal-correction functions of a camera system which in prior art were also performed by a digital signal processor. The main advantage of letting the A/D converter of the camera system perform all these functions lie in presently invented opportunities to render these functions self calibrating against manufacturing variations, and self adjusting against variations in operating conditions. Further advantages will become apparent in the course of the following discussion.

In general, the present invention is operable with any circuit responding monotonically to an input physical stimulus. A photo-integrator is a particular instance of such a circuit. A photo-integrator circuit is an integrator circuit driven by a photo-sensor device. In the particular instance of a photo-integrator circuit for an APS array the photo-sensing device is typically a two, or a three terminal integrated semiconductor device biased such as to generate a current-signal in response to incident illumination. An example of a two terminal semiconductor photo-sensing device is a photodiode. Examples of three terminal semiconductor photo-sensing devices include Metal Oxide Semiconductor (MOS) type photo-gates, and photo-transistors (unipolar, and bipolar). The output of a three terminal semiconductor photo-sensing device can be connected to the input of a photo-integrator directly. The output of a two terminal semiconductor photo-sensing device may require coupling to the input of the photo-integrator by means of an impedance transforming circuit such as a cascode circuit. Such a circuit helps scale (amplify) the available input voltage.

For performance reasons, the photo-integrator circuit used in a two dimensional APS array (i.e., an array suitable for a still or motion video camera) must be an active circuit featuring an active output buffer. Thus analog integrator circuit 10 of FIG. 1 is generally considered to be a minimum acceptable photo-integrator circuit for a two dimensional APS array. We shall make reference to this sole example circuit in all subsequent discussion because this circuit both typifies and exaggerates the problems solved by the present invention. The core of this circuit comprises a (possibly cascode-isolated) two terminal photo-sensing device 12, an integrating capacitor 15, and an output buffer. The output buffer is a source follower circuit comprising Metal Oxide Semiconductor Field Effect Transistor (MOSFET) 16, and current-source load 19. The output of the circuit is the voltage of node 45 relative to ground (i.e., the voltage drop across current source load 19).

Photo-integrator circuit 10 is assumed to have a two phase operating cycle. It is to be understood that this assumption does not limit the invention; other photo-integrator circuits with cycles having more than two phases can be used equivalently. In a two phase operating cycle a first phase is a reset phase, and a second phase is an integration (active) phase. During the reset phase capacitor 15 is pre-charged by means of a temporary connection which places a voltage source VDD across it. During the integration phase this connection is broken, and the capacitor is allowed to discharge with current supplied by the photo-sensor. Specifically, in photo-integrator circuit 10, the connection required to pre-charge capacitor 15 is provided by temporarily activating MOSFET 14. MOSFET 14 is activated by gate control voltage WS. The magnitude of WS is predetermined to bias MOSFET 14 either in the saturation, or in the triode region of its operating characteristic.

For power saving and other practical reasons, it is further desirable to activate the buffer of a photo-integrator circuit only momentarily, on the moment that the array site it occupies is selected for sampling in accordance with an effective scanning schedule. In the example circuit 10, this is accomplished by placing a switch transistor MOSFET 18, between MOSFET 16 and the current-source load 19 of the buffer circuit. This particular placement of MOSFET 18 allows it to act both as site select, and as a site power-down switch. MOSFET 18 is turned on by control voltage RS applied at its gate. The value of RS is such as to cause MOSFET 18 to operate in its triode region. Control voltages WS and RS are timed by the scanning circuits of the array. In particular WS is the Write (reset) Select, and RS is the Read (sample) Select signal generated by the array's scan timers. The scanning circuits (depending on architecture), may select (for reading or writing) either one array site at a time, or simultaneously: a set of array sites, such as all the sites of an array on a sane row; all the sites on a row sensing one color of the sampled color space; or a number of sites in an array neighborhood spanning several columns and rows. The present invention is not limited to these, or any other site selecting option inherent in an array's scan architecture.

A response of photo-integrator 10 is a sample of the voltage across the capacitor 15, taken at a point in time during the integration phase of the operating cycle. This response voltage is not passed to down-stream circuits: what is passed instead, is the voltage at the output of the source follower buffer, namely the voltage across current source load 19. This output voltage is equal to the response voltage (voltage across the capacitor) minus $V_{off}$, where $V_{off}$ is the sum of a bias voltage dropped between the gate and source terminals of MOSFET 16, and of a (nearly) ohmic voltage dropped across MOSFET 18. Thus the output of the photo-integrator is not the response voltage: it is a voltage containing the response and two significant spurious offsets.

In state of the art APS imagers, photo-integrator spurious offsets such as the two just exemplified are removed by a signal processing function known as Correlated Double Sampling (CDS). CDS is a three time slot sampling process the primary function of which is to subtract from the response of a photo-integrator the reference voltage applied across the integration capacitor (e.g. capacitor 15 of circuit 10) during the reset phase of the operating cycle. In the course of the first two time slots of a CDS function the output of the photo-integrator is sampled to obtain one sample output voltage just after the integrating capacitor has pre-charged (reference sample), and one sample output voltage at a predetermined point in time during the integration phase of the operating cycle while the integrating capacitor is discharging (signal sample). During the third time slot the difference between these two samples is obtained by typically applying the two samples as inputs to an analog differential amplifier circuit. The order by which the two CDS samples are taken is arbitrary, i.e., both samples may be taken during phases of the same photo-integration cycle, or split across two cycles with the reference sample taken during the reset phase of the cycle next in sequence. Obtaining the two samples from two different cycles simplifies the hardware, and also allows for spacing the two sampling events closer together. Spacing the two sampling events close together is considered advantageous, because it leads to canceling some low frequency (i.e. the correlated component of) photo-integrator output noise.

The present invention is operable without regard to CDS sampling preference, or to other detail of CDS function implementation. But it is significant to the present invention that CDS can remove the spurious offsets of a photo-integrator circuit only to a first approximation because these offsets are functions of the photo-integrator's output level (CDS produces an output with a residual offset component the value of which is a function of photo-signal level). And residual offsets after CDS interfere with both the white balancing and the gamma correction functionalities of the camera. Unlike CDS, the present invention is capable of removing offsets entirely, and moreover, can do so whether or not the array architecture includes CDS functionality.

Further interfering with the white balancing and gamma correction functionalities of the camera is a photo-integrator offset known to be contributed by a photo-sensor's dark current. The dark current of a semiconductor type photo-sensor is thermal (semiconductor-junction) leakage current. The dark current and photo-current output components of a photo-sensor add constructively, and it is the sum of these two currents that a photo-integrator integrates. Accordingly, input to the photo-integrator's buffer is not a photo-signal; rather it is a voltage composed of a photo-signal component and of a dark-current produced component. The dark current component appears at the output of the photo-integrator as yet another offset voltage. Unlike the offset contributed by a buffer circuit, dark-current contributed offset cannot not be removed with a CDS function. In state of the art high end cameras removing the dark current offset and residual buffer offsets (i.e., those left after CDS), are typically functions that a digital signal processor must perform.

Another limitation of a simple photo-integrator circuit such as photo-integrator 10 is response nonlinearity. Non-linearity interferes first, directly with the white balancing and gamma correction functionalities of the camera, and second, indirectly by making the task of removing the offsets discussed above extremely difficult. In particular, it is not feasible for example circuit 10 to have a linear response, because integrating capacitor 15 is shunted by the output capacitance of the photo-sensing device and by the input capacitance of the source follower. Both these capacitances are non-linear (i.e., their value is a function of the voltage applied across them), so that even when capacitor 15 is a linear capacitor, the response of the photo-integrator exhibits residual nonlinearity in inverse relation to the size of capacitor 15. In general, to secure best noise-figure performance and best sensor device area, it is necessary to make the value of capacitor 15 zero i.e., to let the integrating capacitance of the circuit be the nonlinear capacitance consisting entirely of the output impedance of the photo-sensor in parallel with the input impedance of the source follower. Thus, worst case linearity photo-integrator design is generally accepted: then, linearization becomes a downstream signal processing problem. In state of the art high end cameras response linearization is a further function delegated to the camera's digital signal processor.

In general, a digital signal processor is not very effective in cancelling offsets and nonlinearities of an APS array. A digital signal processor functions in this regard by executing a signal processing algorithm. The algorithm is predetermined to cancel the offsets of a typical APS unit (i.e., a unit not subject to manufacturing variations) operating under typical conditions. And although in principle such algorithms can be parametrized so that they can be calibrated on the manufacturing floor, and that they can be adjusted to field operating conditions, experience has shown that adjustable algorithms are very taxing in computational intensity and place a heavy burden on the user in the field. For these reasons, APS array imagers have not yet penetrated the middle, and high-end camera markets.

The present invention is a practical alternative to using DSP for cancelling offsets and nonlinearities of an APS array. The present invention cancels offsets and nonlinearities of an APS array precisely, using means that inherently self calibrate against manufacturing variations and inherently self adjust to operating conditions. The present invention is not limited to any particular photo-integrator circuit, to any particular choice of photo-sensor device, or to any particular APS architecture (i.e., choices pertaining to array scanning, site addressing etc.). Also the present invention is fully compatible with CDS, and in fact it can complement CDS in offset cancelling action.

A/D Conversion

Figure 3:
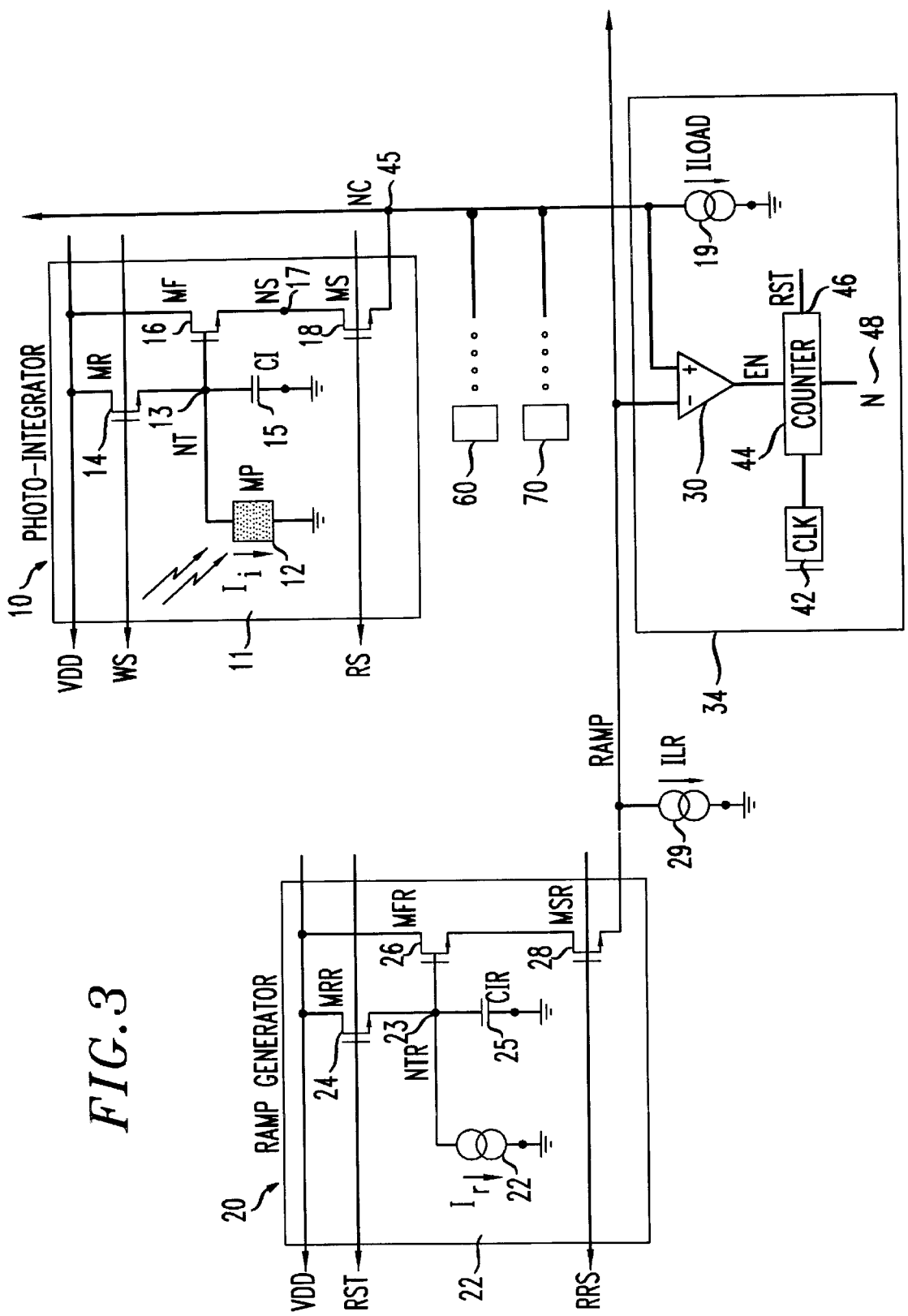
FIG. 3 is a schematic representation of a portion of an active pixel sensor (APS) array including the photo-integrator, ramp generator and analogue to digital converter portions of the instant invention.

As previously mentioned, the base functionality of the A/D converter of the present invention utilizes the single slope integration A/D conversion principle. This principle is well established in the art. Referring now to FIG. 3, a single slope integration A/D converter for converting unipolar signals comprises an output circuit 34, which includes a digital counter 44 and an analog voltage comparator 30. The single slope integration A/D converter also includes a reference signal generator or ramp generator circuit 20. The digital counter is clocked usually near its maximum frequency of operation by a digital clock signal CLK generated by a clock generator 42. Counting can be started by a digital reset signal RST, and halted by a digital halt signal EN, where EN is the output of comparator 30. The signal to be digitized is connected to the input of comparator 30 consistent with phasing requirements for the EN signal. The ramp generator is connected to the remaining comparator input. The ramp generator is initialized with the counter's start or reset signal RST. The signal to be digitized is typically a constant sample of a continuous signal, i.e., the result of a sample and hold operation on a continuous signal. However, if the signal is slowly varying with time as compared to the length of an A/D converter cycle it is also possible that a sample and hold operation on the signal is not performed prior to A/D conversion (for the sake of simplicity we assume that this is the case in all further discussion). The A/D converter cycle has two phases, a reset phase, and a ramping phase. During the reset phase the counter is reset (by signal RST), and the ramp generator is initialized (by signal RST). The ramping phase begins by releasing the counter and the ramp generator simultaneously (trailing edge of an RST signal pulse), so that the counter begins to count as the ramp generator begins to ramp up (or down, as the sense may be). The counter typically up-counts, starting from a zero count, and the ramp generator ramps from a value equal to the reference level of the signal (voltage of node 45), to a value greater than the maximum possible value of the signal (or, to a value less than the minimum possible value of the signal if signal values are negative-stated). An A/D conversion event completes during the ramping phase of the converter cycle on the moment the ramp generator's output crosses the level of the presented (constant valued) signal sample. On, or about that moment, the comparator 30 responds causing the counter to stop and freeze the count. This count is taken as the converter's current digital word output 48.

According to common usage in previous art, the output of the ramp generator 20 of the above converter is a linear function of time, and the frequency of clock signal CLK is a constant (independent of time), such that the converter's output 48 is a count proportional to the signal level at its input (voltage of node 45). However, in the present invention the output of the ramp generator 20 is not necessarily a linear function of time, and the frequency of clock signal CLK is not necessarily a constant. Rather, the output of the ramp generator 20 is a function of time such as to force the converter to output a count 48 proportional to what the signal level would have been if in its path from the sensor's output 13, to the A/D converter's input 45 had not suffered nonlinearity and offset distortion. And the frequency of clock signal CLK may be a function of time forcing the converter to output a companded (i.e., a compressed or expanded) count N instead of a direct count n, where the relation of N to n is prescribed by a nonlinear (companding) function F, such that N=F(n).

According to existing art, single slope integration converters can be far more complex than the simple model discussed above. For example, it is common for a single slope integration A/D converter to offer dynamic self calibrating (offset nulling) features that may or may not be part of a CDS function attached to its input. It is to be understood that the present invention is compatible and does not preclude such, or other known A/D performance enhancing features. Also it is to be understood that the present invention is not limited to the use of any particular model of single slope integration A/D converter (i.e., only a model suitable for converting unipolar signals as discussed above). Essential elements of the present invention are: the ramp generator part 20 of a single slope integration A/D converter circuit; the architectural relationship of the ramp generator 20 to a signal source (photo-integrator 10), or to an array of signal sources (e.g., an array of photo-integrators in an APS imaging array); and the functional dependence of clocking signal CLK to time. The particular implementation of the converter's comparator part 30, counter part 44, and clock generator part 42, is a matter of design choice well within the scope of knowledge of a person skilled in the art.

Ramp Generator Circuits

Figure 2:
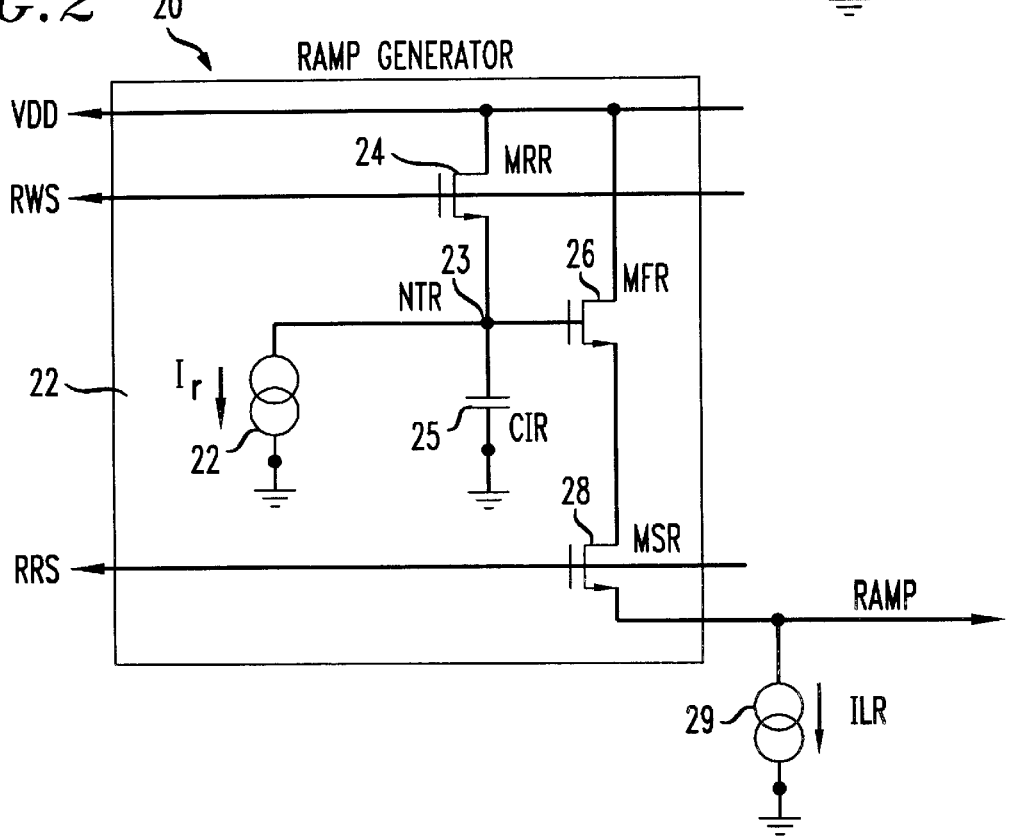
FIG. 2 is a schematic representation of a preferred ramp generator circuit forming a part of the instant invention.

Ramp generator circuits, according to the present invention are generally replicas of varying portions of signal source circuits, and in particular of a photo-integrator circuit being used in a APS array. In one embodiment of the present invention, a ramp generator circuit is an integrated replica of a photo-integrator circuit, except for replacing the photo-sensor device of the circuit with a constant current generator. Thus, ramp generator circuit 20 shown in FIG. 2, is a corresponding ramp generator circuit for photo-integrator circuit 10 shown in FIG. 1. Having this circuit on the same substrate with an APS array, and fabricating it concurrently with the array's photo-integrator circuits subjects it to the same manufacturing variations and to the same operating conditions as the photo-integrators of the array. Thus the behavior of such a ramp generator expectedly tracks entirely the behavior of an array photo-integrator with respect to nonlinearity; and it can track entirely the behavior of an array photo-integrator with respect to all possible offsets except for offset contributed by a photo-sensor's dark current. A ramp generator can further be made to track offset contributed by a photo-sensor's dark current by using one of the following two methods.

According to a first method, the output of example ramp generator 20 is offset by a required voltage level at the onset of the ramp generation cycle e.g., by initializing the generator with a voltage value VDD that is offset (reduced) relative to the voltage value VDD used to initialize an array photo-integrator. For best advantage, a source supplying this initializing voltage level self calibrates against manufacturing variations and self adjusts to variations in operating conditions. Thus for example, one might incorporate into a design of such source a replica photo-integrator circuit with its photosensor blinded, in a way that would directly cause the characteristics of the source to track manufacturing variations and variations in operating conditions. The details of designing such a source fall well within the knowledge of a person familiar in the art.

Figure 4:
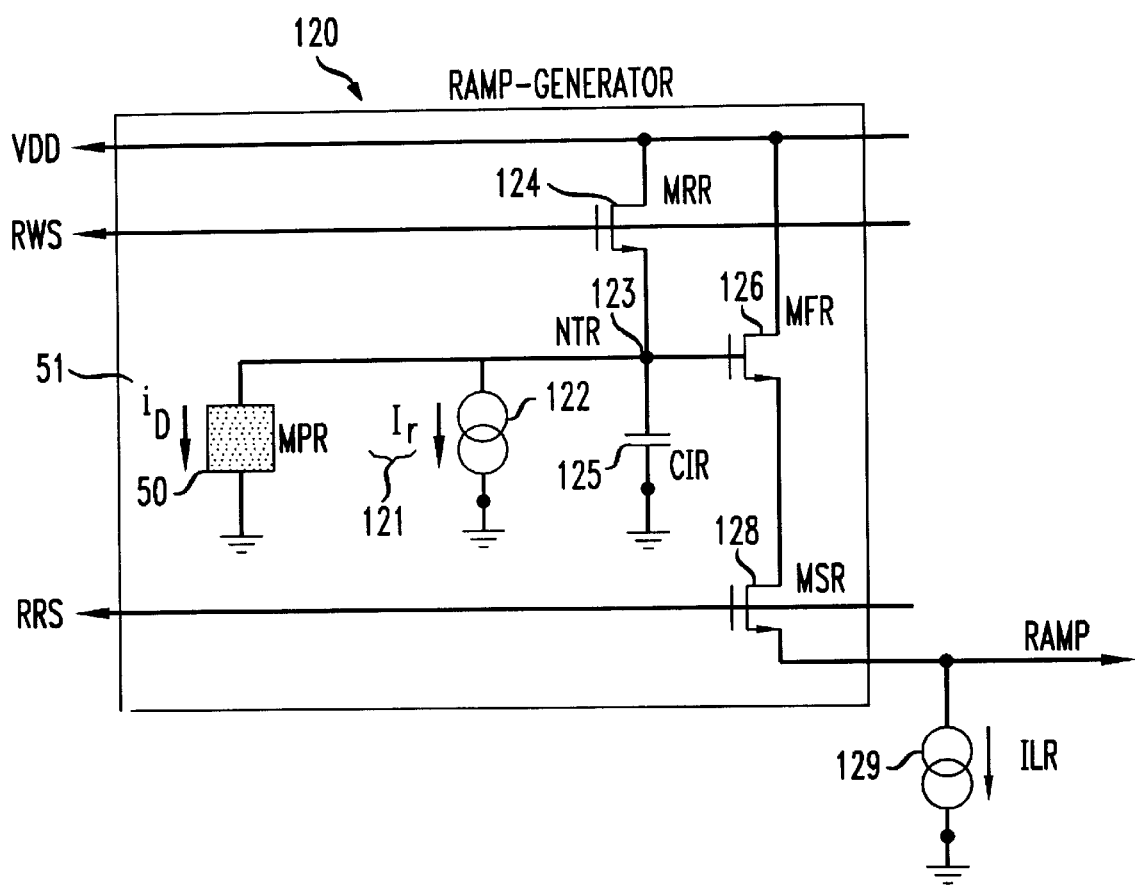
FIG. 4 is an alternate embodiment of the ramp generator of the instant invention.

According to a second method, the ramp generator circuit is an integrated replica of a photo-integrator with a constant current generator connected in parallel with the photo-sensor, and with the photo-sensor blinded to input radiation. Thus, ramp generator circuit 20 shown in FIG. 4, is another corresponding ramp generator circuit for photo-integrator circuit 10 shown in FIG. 1. The output of such a ramp generator is canonically offset by the dark current of the blinded cell. Thus assuming that the photosensor is a type of device producing dark current at a rate not dependent on input (or for that matter, output) level, all nonlinearities and offsets produced by this ramp generator track the offsets and nonlinearities of a photo-integrator, self calibrating against manufacturing variations and self adjusting to variations in operating conditions.

An operating difference exists between the above two methods as follows. A ramp generator (such as generator 20 of FIG. 2) employing the first method to generate dark current offset, requires a two phase operating cycle i.e., a cycle with a first phase being a reset phase and a second phase being ramp generating phase. A ramp generator (such as generator 120 of FIG. 4) employing the second method, requires a three phase operating cycle i.e., a cycle with a first phase being a reset phase, a second phase being a dark current integration (offset generation) phase, and a third phase being a ramp generating phase. This difference impacts APS imager architecture. For example, in an imager using per column A/D converters, if the number of columns is C, and the number of rows is R, there will be C number of A/D converters: then if the first of the two methods of generating dark current offset is employed, there is need for only one ramp generator and for one associated voltage source to generate the initial ramp offset (although a larger number of these voltage sources might be used in order to average dark field gradients); if the second method of generating dark current offset is employed, there is need for at least R number of ramp generators. Typically, these ramp generators must be arranged as a column, and placed on the left, or right side of the photo-integrator array. Then each ramp generator's reset, integration, and ramping operating phases are made to coincide respectively with the reset, integration, and the A/D conversion phases of the operating cycle of the photo-integrators of the same array row. Use of multiple voltage sources in connection with a ramp generator constituted according to the first method entails similar (left/right side of the array) placement of a column of voltage sources. Variations on this basic alignment of a single ramp generator column, or offset voltage generator column relative to the photo-integrator array include using more than one ramp column generators per APS array. Using several columns of offset generators per APA array creates opportunity to generate averages of offsets, or offsets that better track the spatial variation of offsets of photo-integrators in ways that are well known in the art, and particularly in the art of CCD imagers.

Integrating on the same silicon substrate with APS photo-integrators ramp generators according to the preceding description, makes it possible to create reference ramp signals for an A/D converter where the signals contain nonlinearities and offsets in the precise amounts needed to cancel out (during the A/D conversion process) all possible nonlinearities and offsets that typically distort the output of an APS photo-integrator. Preferably, the comparator, clock, and counter parts of the A/D converter (or converters as architecture may dictate) of the present invention are also integrated on the same silicon substrate with the APS array, although this is only for keeping the cost of the A/D converter down and not for any performance reason.

Using either of the above ramp generators to drive a single slope integration A/D converter of an APS imaging array, permits a direct comparison of a photosensor's response current to the current driving the ramp generator. This is possible because the ramp function and the photo-integrator function are both monotonic, and therefore a direct comparison of the output of the ramp generator and the photo-integrator translates into a direct comparison of the current driving the ramp generator and the photo-current driving the photo-integrator. In symbolic terms, given two arbitrary time intervals T and t, if the ramp generator output $V_r$ is a function R of (constant) input current $I_r$ such that $V_r = R(I_r*t+I_o*T)$, and the photo-integrator output $V_i$ is a function F of (the average over a period T) input photo-current $I_i$ such that $V_i = F(I_i*T+I_o*T)$, where $I_o$ is the average photosensor dark current over the period T: since by construction, the functions R and F are substantially identical and monotonic, then when the comparator asserts an input equality event $V_r = V_i$, it asserts $R(I_r*t+I_o*T)=F(I_i*T+I_o*T)$, and therefore it also asserts $I_r*t=I_i*T$. This implies that in the course of an A/D conversion cycle, the time t it takes the output of a ramp generator $V_r$ to reach the level of a photo-integrator's output $V_i$, relates to the photo-current $I_i$ according to:

$$t=T/I_r*I_i,\qquad\text{Eq. 1}$$

T is a fixed time by which the photo-integrator is allowed to integrate prior to an A/D converter cycle, and t is the time interval the counter of the A/D converter captures and outputs. In the first of the two types of ramp generators the value of the term $(I_o*T)$ is a constant (continually adjusting from cycle to cycle) establishing an initial (nonzero) value of ramp generator output. In the second of the two types of ramp generators, the value of the term $(I_o*T)$ is built during an integration phase of duration T (or possibly a scaled value of T, used in connection with a scaled value of $I_o$) preceding the ramp generating phase of the ramp generator's cycle; i.e., during this integration (offset generation) phase, the output of the ramp generator begins with a zero value offset term and ends with a value containing an offset term $(I_o*T)$. Thus according to the present invention, the output of the A/D converter is directly proportional to $I_i$, even in the presence of photo-sensor generated dark current, and even though the function F may be nonlinear and may be corrupting the signal path by contributing arbitrary offsets. The present invention guarantees this result by means of enforcing substantial identity between the functions F and R, and by means of forcing these functions to substantially track each other with respect to manufacturing variations and variations in operating conditions.

Figure 5:
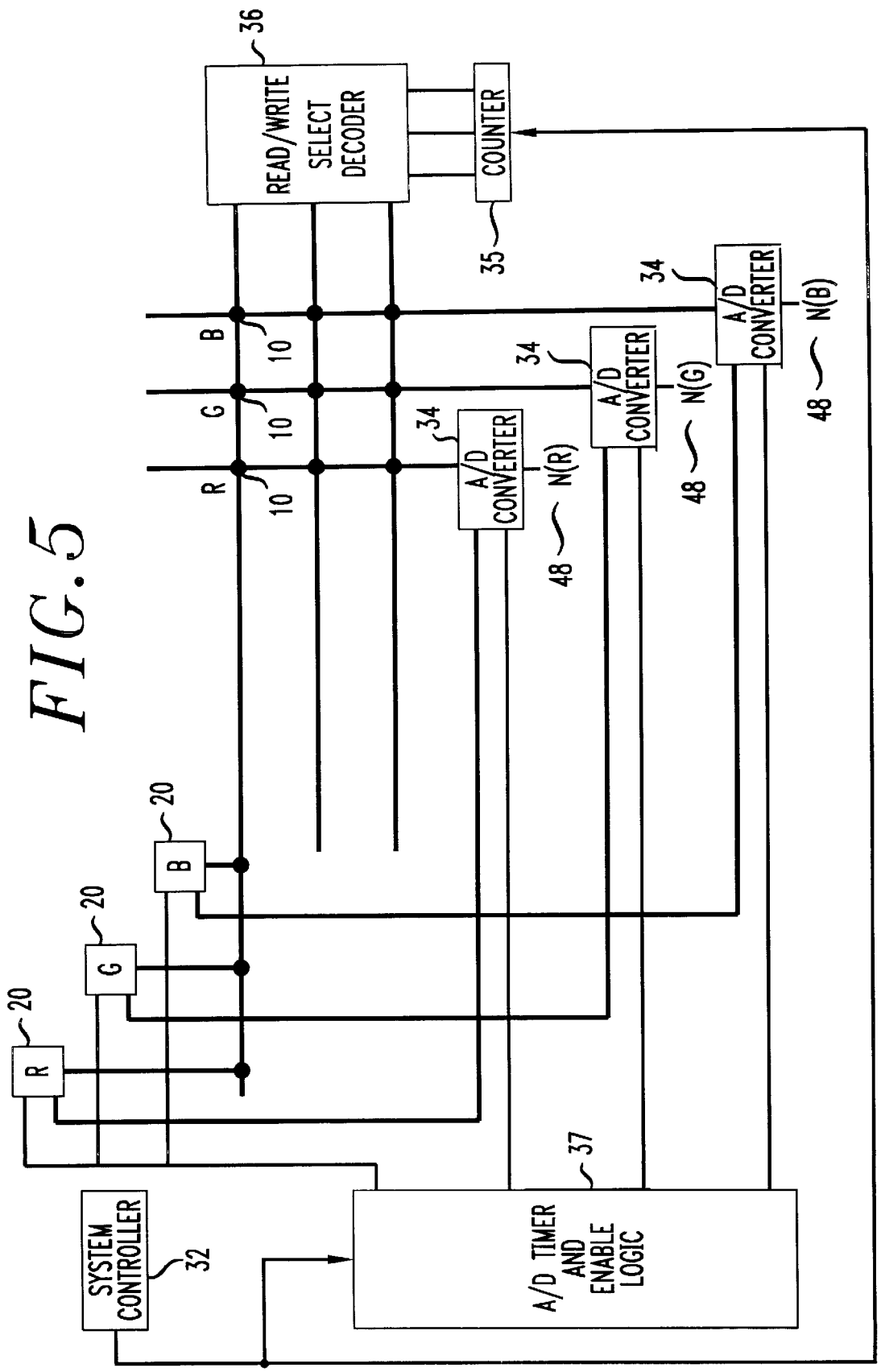
FIG. 5 is a representation of a currently preferred embodiment of an APS array configured in accordance with the instant invention.
Figure 6:
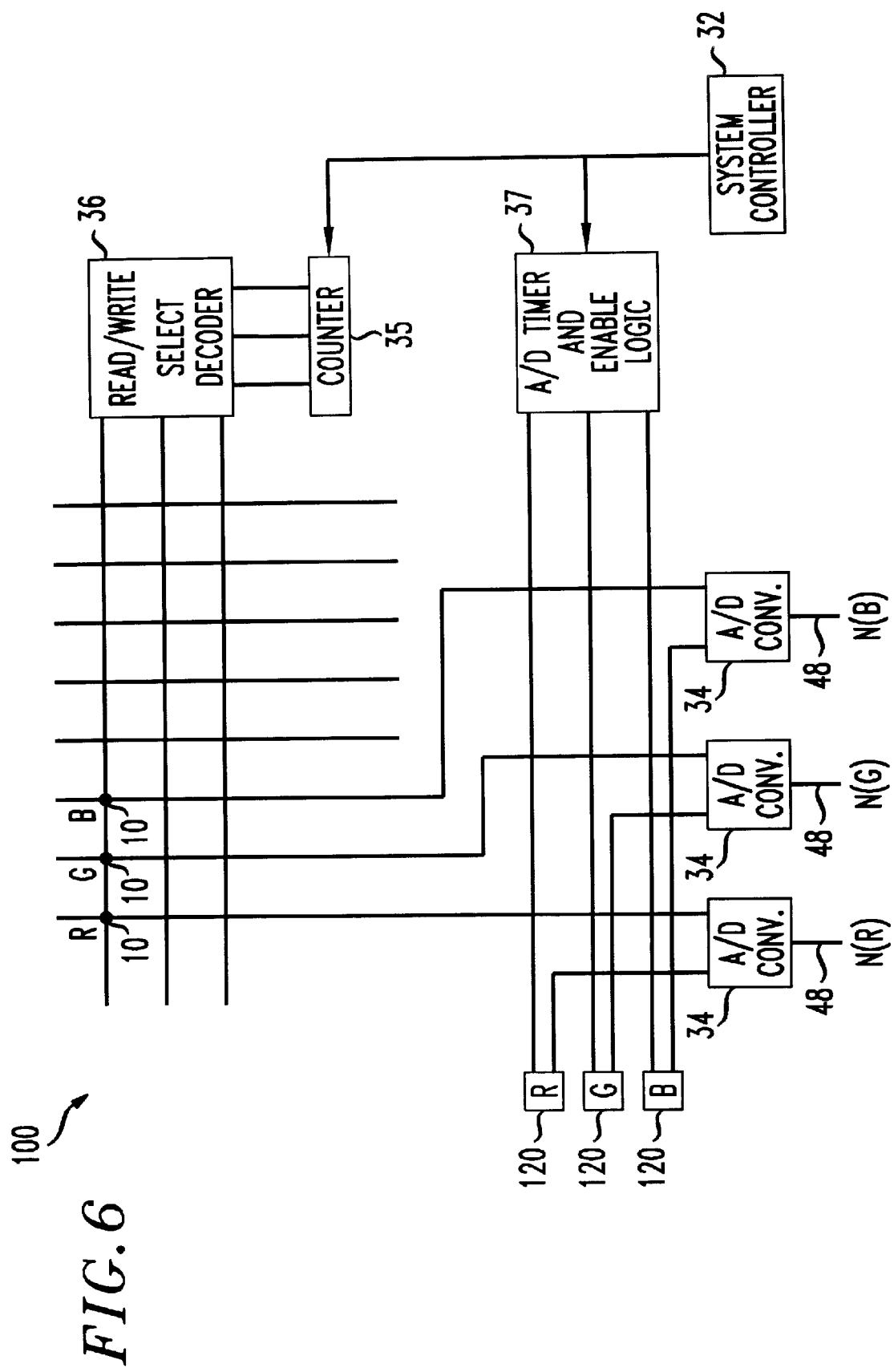
FIG. 6 is an alternate embodiment of an APS array configured in accordance with the instant invention.

White Balancing:

In another embodiment of the present invention the proportionality constant $(T/I_r)$ of Eq. 1, is used as a parameter to advantageously implement the white balancing function required in color imaging applications. White balancing corrects for sensor sensitivity variation across the radiation spectrum. A silicon based photo-sensor for example, is most sensitive near the green part, and least sensitive in the blue part of the visible spectrum. A color camera compensates for these differences by inserting equalizing gain in the separate color components of its signal path. For example, in the case of an APS array imaging in the Red, Green, Blue (RGB) color space, white balancing according to the present invention is performed by forcing for the constant current source $I_r$ (and hence the parameter $T/I_r$) of a ramp generator to assume one value from a set comprising a value for red, a value for green, and a value for blue, respectively for ramping the conversion of a red, green, or blue signal sample. Sets of values for the constant current source are defined during manufacture, and can be device specific, illumination source and level specific, and other operating conditions specific. These sets are stored in the firmware of a camera system. Selection of the appropriate set for given conditions may be automatic, or may burden the camera's operator. Referring now to FIGS. 5 and 6, in these FIGs. it is shown schematically how the two different ramp generator sources impact the architecture of an APS array. In FIG. 5, ramp generators 20 are of the type as exemplified in FIG. 4. In FIG. 6, ramp generators 120 are of the type exemplified in FIG. 2. The significant difference is the number of ramp generators required and the impact on the control signal generators. FIG. 6 depicts that only as few ramp generators 20 are required as there are colors in the color sampling space (here the example space is RGB). FIG. 5 depicts that at least as many ramp generators 120 are required as there are array rows, times the number of colors in the color sampling space (e.g., RGB).

The reasons for this difference have already been discussed. The only difference among ramp generators used in each architecture is the value of their current source $I_r$. There are three different valued current sources used in the architecture of FIG. 5 and also three in the architecture of FIG. 6 (i.e., one each for the three colors in the example RGB color space).

Additionally FIGS. 5 and 6, exemplify control-signal generation and routing. The Read/Write select signals WS, RS, RWS, RRS required by the photo-integrators and ramp generators circuits of an APS array, are typically generated by decoder logic driven by counters. The A/D converters are timed by timer and enable logic generators. Timing is also likely to be under control of a system controller (e.g., a microprocessor).

Gamma Correction

Gamma correction is a signal companding process. A companding process distorts a signal for some purpose, in this case for the purpose of counteracting (downstream) a display device's nonlinear response. Display devices typically exhibit a power-law response, gamma being the value of the power. Hence, gamma correction is an inverse (1/gamma) power-law companding process. Different industry standards call for different values of gamma. For example, the NTSC standard (US and Japan TV) calls for a gamma of 2.2; the PAL standard (European TV) calls for a gamma of 2.8.

According to the present invention, gamma correction is accomplished by causing the A/D converter to produce at the end of a converter cycle a (corrected) count N, in lieu of an (uncorrected) count n, where N is proportional to the 1/gamma power of n. This is accomplished by applying a frequency-sweep on the clock signal 42 driving the clock counter, shown in FIG. 3. For example, if we assume that the phase of clock signal 42 is a function of time $\phi(t)$, and the counter increments at each value of t at which $\phi(t)$ is an integer multiple of $2\pi$, then the counter produces a count:

$$N=1/2\pi\phi(t)\qquad\text{Eq. 2}$$

Thus by defining φ(t) as:

$$\phi(t) = 2\pi(f_c \cdot t)^\gamma \qquad \text{Eq. 3}$$

where $f_c$ is a clock frequency value effective at the beginning of a clock ramp, and using the value of t defined by Eq. 1, an A/D conversion event produces a count $$N = (f_c \cdot T/I_r \cdot I_i)^\gamma = n^\gamma, \qquad \text{Eq. 4}$$

as desired. The clock-phase function φ(t) can be generated by using tables in connection with a counter, or by analog means e.g., by using a voltage controlled oscillator in connection with a non-linear ramp signal source. The design of such means are well within the abilities of a person skilled in the art.

What is claimed is:

1. A signal processing circuit highly immune to manufacturing variations and variations in operating conditions for outputting a digital word corresponding to a physical stimulus controlled current source, said circuit comprising:

an analog integrator circuit responsive to said physical stimulus controlled current source for outputting a first signal representative of said physical stimulus controlled current source;

a reference signal generator circuit responsive to a constant current source for outputting a second signal, said second signal being a ramp signal;

an output circuit including a comparator for receiving said first and said second signals and for comparing said first signal against said second signal, said output circuit also including a counter for generating said digital word representative of a time interval defined by a start signal and an end signal, said end signal representing a transition of the output of the comparator; and the reference signal generator circuit and the analog integrator circuit being parts of a semiconductor integrated circuit fabricated on a single semiconductor substrate, and the reference signal generator being a scaled replica of the analog integrator circuit.

2. The invention of claim 1 wherein said physical stimulus controlled current source is a first photo-sensor device.

3. The invention of claim 2, further including an operating cycle for said reference signal generator circuit, said operating cycle including a ramp output phase and the initial value of the output of the reference signal generator circuit is an operating variable.

4. The invention of claim 3 wherein the output of the analog integrator circuit is offset by a component attributable to dark-current generated by said photo-sensor device.

5. The invention of claim 4 further comprising a second photo-sensor device, said second photo-sensor device being a blinded photo-sensor device, said first photo-sensor device and said second photo-sensor device being semiconductor devices fabricated on a common semiconductor substrate, and the second photo-sensor device being a scaled replica of said first photo-sensor device; and the initial value of the output of the reference signal generator circuit being generated by causing said generator circuit to integrate the output of the second photo-sensor over a predetermined time interval.

6. The invention of claim 5 wherein the output of the signal processing circuit has a predetermined functional relationship (circuit response function) to the output of the first photo-sensor device, the circuit response function being determined by a clock signal input to the counter of said output circuit, and the phase of said clock signal being a predetermined function of time.

7. The invention of claim 1 wherein said signal processing circuit is a semiconductor integrated circuit fabricated on a single semiconductor substrate.

8. The invention of claim 7 wherein said semiconductor integrated circuit comprises an array of signal processing circuits.

9. The invention of claim 8 wherein both said reference signal generator circuit and said output circuit in at least one of the array of signal processing circuits is time shared by a number of analog integrator circuits.

10. The invention of claim 9 wherein the value of the constant current source is an operating parameter updatable prior to execution of a ramp output phase of an operating cycle.

11. The invention of claim 10 wherein the array of signal processing circuits is organized in sets, each set being dedicated to sensing one segment of input radiation spectrum, and the value of the constant current source being selected so as to cause the output circuit to produce a predetermined output when the array is stimulated with white (flat spectrum) radiation of a predetermined intensity.

12. A semiconductor integrated Analog to Digital (A/D) converter circuit comprising:

an analog comparator;

a digital counter;

a reference ramp generator;

a constant current source; and a signal generator; wherein the analog comparator compares the output of the reference ramp generator to an analog input signal;

the digital counter counts cycles of an input clock signal;

the reference ramp generator is driven by the constant current source;

the reference ramp generator responds to the driving constant current source by generating a predetermined monotonic function of time (ramp function);

the initial value of the ramp function is an operating variable;

the value of the constant current source is an operating parameter;

the A/D converter operating cycle has at least two phases, a reset phase and an active phase;

the ramp generator and the digital counter are simultaneously initialized during the reset phase;

the ramp generator comprises a scaled replica of the signal generator circuit;

the signal generator generates an output in response to a physical stimulus continuously applied to the converter circuit; and an output of the A/D converter is a count attained by the digital counter during a time interval beginning with the onset of the active phase of an A/D converter operating cycle, and ending on an analog comparator output transition.

13. A semiconductor integrated circuit according to the invention of claim 12 wherein:

said applied physical stimulus comprises a physical stimulus controlled current source (sensor device);

the signal generator generates output in response to the physical stimulus applied to the sensor device; and the signal generator generates a monotonic function of time while physical stimulus is applied to the sensor device.

14. The invention of claim 13, wherein the signal generator circuit is an active integrator.

15. The invention of claim 14, wherein the sensor device is a photo-sensor, and the combination of sensor device and active integrator circuit functions as an active photo-integrator.

16. The invention of claim 15, wherein:

the output of the active integrator is offset by a component attributable to dark-current produced by the photo-sensor;

and the value of this offset is used as the initial value of the ramp function.

17. The invention of claim 16, further comprising a blinded photo-sensor, and wherein:

the initial value of the ramp function is generated by causing the reference ramp generator to integrate the output of the blinded photo-sensor over a predetermined time interval.

18. The invention of claim 12, wherein the phase of the clock generator circuit is a predetermined function of time.

19. The invention of claim 18 wherein:

$f_c$ is a constant scaling factor;

$\gamma$ is a predetermined constant;

and the phase $\phi(t)$ of the clock generator circuit is defined by the following function f time t:

$$\phi(t)=2\pi(f_c*t)^\gamma$$

20. A semiconductor integrated circuit comprising an array of A/D converters according to claim 12 and an array of signal generating sources, wherein a signal generating source comprises:

said signal generator;

a physical stimulus controlled current source (sensor device); and wherein, the signal generator generates output in response to physical stimulus applied to the sensor device;

the signal generator generates a monotonic function of time while physical stimulus is applied to the sensor device; and each ramp generator in each instance of an A/D converter is a scaled replica of the signal generator.

21. The invention of claim 20 wherein the array of A/D converters is of a lesser size than the array of signal generating sources;

and each A/D converter is time shared by a set of signal generating sources.

22. The invention of claim 21 wherein:

the value of the constant current source is independently set for each A/D converter of the array, and the value of each constant current source is updatable prior to executing an operating cycle of the A/D converter.

23. The invention of claim 22, wherein the array of signal generating sources is organized in sets;

each set is dedicated to sensing one segment of input radiation spectrum;

and the value of the constant current source of all the A/D converters time-shared by signal generators in the same set is the same.

24. The invention of claim 23, wherein the value of the constant source of each A/D converter is selected such as to cause each A/D converter to produce the same output count when the array is stimulated with constant, white (flat spectrum) radiation.

25. A semiconductor integrated circuit comprising an Analog to Digital (A/D) converter circuit of the single slope integration type, wherein said A/D converter comprises:

an analog comparator subcircuit having an analog signal input terminal, an analog reference input terminal, and a digital signal output terminal;

a digital counter subcircuit, having a clock signal input terminal, a control enable input terminal, and a control reset input terminal, wherein a phase of a clock generator circuit generating said clock signal is a predetermined function of time;

a ramp generator subcircuit having a signal input terminal, a signal output terminal, and a control reset input terminal;

a reference constant current generator; and wherein the digital output of the analog comparator circuit is connected to the enable terminal of the digital counter subcircuit;

the output of the ramp generator subcircuit is connected to the reference input terminal of the analog comparator subcircuit;

the input terminal of the ramp generator is connected to the reference constant current generator;

the subcircuits and the current source share a common signal reference node (circuit ground node);

the input terminal of the A/D converter is the input terminal of the analog comparator subcircuit;

the response of the ramp generator circuit to the input constant current generated by the reference constant current generator is a predetermined monotonic function of time (ramp signal);

an A/D converter operating cycle has at least two phases, a reset phase and a ramping phase;

the digital counter subcircuit and the ramp generator subcircuit are simultaneously reset during the reset phase of the operating cycle;

at the onset of the ramping phase of an operating cycle, the ramp generator is enabled to generate output simultaneously as the digital counter is enabled to count clock signal pulses;

the ramp generator output assumes a predetermined value at the beginning of the ramping phase;

the value assumed by the output of the ramp generator at the beginning of the ramping phase is an operating variable of the A/D converter circuit;

the value of the constant current source connected to the input of the ramp generator is an operating variable of the A/D converter circuit;

an output of the A/D converter circuit is a count of the digital counter subcircuit; and an output of the A/D converter circuit is a count attained by the digital counter in a time interval beginning with an onset of a ramping phase of an operating cycle and ending within the same ramping phase on the occasion of a transition of the digital output of the analog comparator subcircuit.

26. A semiconductor integrated circuit according to the invention of claim 25, further comprising:

a signal generator subcircuit having a signal input terminal, a signal output terminal, and a control (timing) reset input terminal;

a signal current source controlled by a physical stimulus; and wherein, the signal current source is connected to the input terminal of the signal subcircuit;

the signal generator subcircuit and the current source share a common reference node;

the reference node shared by the signal generator subcircuit and the signal current source is the common signal reference node (circuit ground node);

the output terminal of the signal generator subcircuit is connected to the input terminal of the A/D converter subcircuit;

an operating cycle of the signal generator subcircuit has at least two phases, a reset phase, and an active phase;

during the reset phase of the operating cycle of the signal generator subcircuit, the output of the signal generator subcircuit is set to a predetermined value;

during the active phase of the operating cycle of the signal subcircuit the signal generator subcircuit responds monotonically to the signal current source;

an A/D converter cycle is executed at the end of an operating cycle of the signal generator subcircuit;

the output of an A/D converter cycle is a digital word representing a weighted average value of current generated by the signal current source during the active phase of the operating cycle of the signal subcircuit;

an operating cycle of the signal generating subcircuit is executed by timing circuits under the control of a digital controller;

an operating cycle of the A/D converter is aligned with respect to an operating cycle of the signal subcircuit by timing circuits operating under the control of a digital controller.

27. A semiconductor integrated circuit according to the invention of claim 26, wherein the signal generator subcircuit and the ramp generator subcircuit are identical circuits.

28. A semiconductor integrated circuit according to the invention of claim 27, wherein the signal generator subcircuit is an active integrator.

29. A semiconductor integrated circuit according to the invention of claim 28, wherein the signal current source is a photo-sensor.

30. A semiconductor integrated circuit according to the invention of claim 29, wherein the combination of a photo-integrator circuit and signal current source is an active photo-integrator subcircuit.

31. A semiconductor integrated circuit comprising an array of photo-integrator subcircuits and an array of A/D converter subcircuits according to the invention of claim 30.

32. A semiconductor integrated circuit according to the invention of claim 31, comprising a two dimensional array of photo-integrator subcircuits and an one dimensional array of A/D converter subcircuits, and wherein:

each A/D converter subcircuit is dedicated to converting the output of a subset of photo-integrator subcircuits;

each A/D converter is time-shared by the photo-integrator subcircuits in the set to which it is dedicated.

33. A semiconductor integrated circuit according to the invention of claim 32, wherein the value of the reference constant current generator takes a value that is individually predetermined for each A/D converter subcircuit.

34. A semiconductor integrated circuit according to the invention of claim 33, wherein the array of photo-integrator circuits is organized in overlapping sets of photo-integrators and wherein: each set is dedicated to sensing one segment of input radiation spectrum.

35. A semiconductor integrated circuit according to the invention of claim 34, wherein the reference constant current generator circuits of the A/D converter array take predetermined values such as to cause the A/D conversion process to produce equalized (white balanced) response across the input radiation spectrum.

36. A semiconductor integrated circuit according to the invention of claim 29, further comprising:

a blinded photosensor; and wherein:

the blinded photo-sensor is connected in parallel with the reference constant current generator;

the operating cycle of the ramp generator subcircuit has at least three phases, a reset phase, an offset generation phase, and a ramp generation phase;

during the offset generation phase, the reference constant current generator is rendered inactive;

current flowing through the blinded photo-sensor during the offset generating phase of the operating cycle of the ramp generator subcircuit generates a ramp generator output;

the final value of the ramp generator output generated during the offset generation phase of the operating cycle of the ramp generating subcircuit is the initial value of the ramp generator output generated by the ramp generator subcircuit during the ramp generation phase of the ramp generating subcircuit.

37. A semiconductor integrated circuit according to the invention of claim 25 wherein:

$f_c$ is a constant scaling factor;

$\gamma$ is a predetermined constant;

and the phase $\phi(t)$ of the clock generator circuit is defined by the following function of time t:

$$\phi(t)=2\pi(f_c{}^*t)^\gamma$$

38. A semiconductor integrated circuit according to the invention of claim 25, further comprising:

a signal generator subcircuit having a signal input terminal, a signal output terminal, and a control (timing) reset input terminal;

a sample and hold (S/H) subcircuit, having a signal input terminal, a signal output terminal, and a control (timing) sample/hold terminal;

a signal current source controlled by a physical stimulus; and wherein the signal current source is connected to the input terminal of the signal subcircuit;

the signal generator subcircuit, the sample and hold subcircuit, and the signal current source share a common reference node;

the signal output terminal of the signal generator subcircuit is connected to the signal input terminal of the S/H subcircuit;

the signal output of the S/H converter subcircuit is connected to the signal input generator of the A/D subcircuit; the reference node shared by the signal generator subcircuit, the S/H subcircuit, and the signal current source is the common signal reference node (circuit ground node);

an operating cycle of the sample and hold subcircuit has at least two phases, a sampling phase and a hold phase;

an operating cycle of the signal generator subcircuit has at least two phases, a reset phase, and an active phase;

during the reset phase of the operating cycle of the signal generator subcircuit, the output of the signal generator subcircuit is set to a predetermined value;

during the active phase of the operating cycle of the signal subcircuit the signal generator subcircuit responds monotonically to the signal current source;

an operating cycle of the sample and hold subcircuit is executed during the active phase of the operating cycle of the signal generator circuit;

an A/D converter operating cycle is executed upon completion of a said operating cycle of the sample and hold subcircuit;

the output of an A/D converter cycle is a digital word representing a weighted average value of current generated by the signal current source during the portion of the active phase of the operating cycle of the signal subcircuit, beginning with at the beginning of the active phase of the operating cycle of the signal generating subcircuit and ending at the beginning of the hold phase of the operating cycle of the sample and hold subcircuit;

an operating cycle of the signal subcircuit is executed by timing circuits under the control of a system controller;

an operating cycle of the sample and hold subcircuit is aligned with respect to an operating cycle of the signal generating subcircuit by timing circuits under the control of a system controller;

an operating cycle of the A/D converter is aligned with respect to an operating cycle of the sample and hold subcircuit by timing circuits operating under the control of a system controller.

39. A signal processing circuit highly immune to manufacturing variations and variations in operating conditions for outputting a digital word corresponding to stimulus applied to a photo-sensor device, said circuit comprising:

an analog integrator circuit responsive to said photo-sensor device for outputting a first signal representative of said device;

a reference signal generator circuit responsive to a constant current source for generating a second signal, said second signal being a ramp signal and the reference signal generator being a scaled replica of the analog integrator circuit; and an output circuit including a comparator for receiving said first and said second signals and for comparing the level of said first signal against the level of said second signal, said output circuit also including a counter for generating said digital word representative of a time interval defined by a start signal and an end signal, said end signal representing a transition of the output of the comparator.

* * * * *